(12) United States Patent
Chow et al.

(10) Patent No.: US 7,968,377 B2
(45) Date of Patent: Jun. 28, 2011

(54) INTEGRATED CIRCUIT PROTRUDING PAD PACKAGE SYSTEM

(75) Inventors: Seng Guan Chow, Singapore (SG); Ming Ying, Singapore (SG); Il Kwon Shim, Singapore (SG); Roger Emigh, Mesa, AZ (US)

(73) Assignee: Stats Chippac Ltd., Singapore (SG)

( * ) Notice: Subject to any disclaimer, the term of this patent is extended or adjusted under 35 U.S.C. 154(b) by 718 days.

(21) Appl. No.: 11/162,785

(22) Filed: Sep. 22, 2005

(65) Prior Publication Data
US 2007/0063322 A1    Mar. 22, 2007

(51) Int. Cl.
*H01L 21/00*    (2006.01)
(52) U.S. Cl. ........ 438/113; 438/111; 438/123; 438/125; 438/126; 438/108; 438/612; 257/678; 257/E21.504
(58) Field of Classification Search .......... 438/123, 438/125, 126, 108, 612, 113, 111; 257/678, 257/E21.504
See application file for complete search history.

(56) References Cited

U.S. PATENT DOCUMENTS

| 5,197,183 | A | 3/1993 | Chia et al. ........................ 29/827 |
| 5,554,886 | A | 9/1996 | Song |
| 5,770,888 | A | 6/1998 | Song et al. |
| 6,420,779 | B1 | 7/2002 | Sharma et al. ................ 257/666 |
| 6,462,273 | B1 * | 10/2002 | Corisis et al. ................. 174/521 |
| 6,559,526 | B2 | 5/2003 | Lee et al. |
| 6,713,322 | B2 * | 3/2004 | Lee .............................. 438/123 |
| 6,803,648 | B1 | 10/2004 | Kelkar et al. |
| 2003/0132512 | A1 * | 7/2003 | Yasuda et al. ................ 257/672 |
| 2005/0186711 | A1 * | 8/2005 | Yee et al. ...................... 438/123 |
| 2006/0035414 | A1 * | 2/2006 | Park et al. ..................... 438/124 |

* cited by examiner

*Primary Examiner* — Junghwa M Im
(74) *Attorney, Agent, or Firm* — Mikio Ishimaru

(57) ABSTRACT

An integrated circuit package system is provided. A protruding pad is formed on a leadframe. A die is attached to the leadframe. The die is electrically connected to the leadframe. At least portions of the leadframe, the protruding pad, and the die are encapsulated in an encapsulant.

4 Claims, 12 Drawing Sheets

INTEGRATED CIRCUIT PROTRUDING PAD PACKAGE SYSTEM

TECHNICAL FIELD

The present invention relates generally to integrated circuits, and more particularly to package structures for integrated circuits.

BACKGROUND ART

In the electronics industry, a continuing need is to further and further reduce the size and weight of electronic devices while simultaneously increasing performance and speed. Cellular telephones, personal data devices, notebook computers, camcorders, and digital cameras are but a few of the consumer products that require and benefit from this ongoing miniaturization of sophisticated electronics.

Integrated circuit ("IC") assemblies for such complex electronic systems typically have a large number of interconnected IC chips. The IC chips, commonly called dies, are usually made from a semiconductor material such as silicon or gallium arsenide. Photolithographic techniques are used to form the various semiconductor devices in multiple layers on the dies.

Dies are encapsulated in a molded plastic package that has connectors or leads on the exterior of the package that function as input/output terminals for the die inside the package. The package includes a leadframe, a die mounted on the leadframe, and wires.

The die is conventionally mounted to the top surface of the leadframe with, for example, a layer of an adhesive or an adhesive film, and then electrically connected to the leadframe by a number of fine, conductive wires, typically gold (Au) or aluminum (Al), that electrically connect the die to the leadframe. The wires are attached to the die at the bonding pads of the die, which are located around the periphery of the die.

After the wires are attached, the die, the leadframe, and the conductive wires are encapsulated in a mold compound, such as plastic or epoxy. The encapsulation protects the leadframe, the die, and the fine conductive wires from physical, electrical, moisture, and/or chemical damage.

The encapsulation process begins by placing the leadframe, the die, and the fine conductive wires in a mold. Next, a mold compound is injected into the mold. The mold compound flows through the mold, encasing the leadframe, the die, and the conductive wires.

Typically, a mold encapsulates multiple semiconductor devices at the same time. A two part mold mounted on a hydraulic press is generally used.

Initially the two halves of the mold are held apart. One or more lead frames containing semiconductor devices are placed in an open half of the mold. The hydraulic press is then actuated and the mold closed, forming a cavity around each semiconductor die. It is not unusual for a mold to contain thousands of cavities. Each of these cavities is connected by one or more gates, channels, and runners to one or more softened plastic central reservoirs or pots. A worm screw or ram compresses the plastic so that it flows into the cavities. As soon as the plastic has hardened, the mold is opened and the molded plastic packages removed.

Frequently, moveable pins are built into the mold to align the mold parts, to hold the lead frames in a particular location during molding or to provide automatic ejection of the encapsulated parts. Also, the mold may contain other moving parts such as variable gates, vents, and dams. Thus, molds for encapsulating electronic parts, particularly semiconductor parts, are often very complicated.

In order to push liquefied plastic from the reservoirs into the many cavities, it is frequently necessary to inject or transfer the plastic at very high pressures. If the mold halves fail to seal tightly against each other or against the lead frames, undesired or unintended crevices may be present therebetween. At such high pressures, the crevices fill with plastic during encapsulation, producing unwanted thin webs of plastic. These thin webs of plastic are referred to as "flash" and can result from such imperfect sealing of the mold. Before the encapsulated electronic devices can be used, this flash must be removed. This increases the cost of manufacture and is undesirable. Also, flash is a significant cause of mold wear, requires additional labor for mold cleaning between molding cycles, and increases mold down-time.

In order to minimize flash, great pains are generally taken to machine the mating surfaces of the mold halves flat and parallel where they are to seal. Usually, they are carefully inspected for planarity during manufacture and after installation in the press. Powerful hydraulic cylinders in the mold force the mold halves tightly against the lead frames and each other. However, the force that can be applied in an effort to seal the mold is limited, since excessive force causes coining of the lead frames and rapid mold wear.

As a result, adhesives, such as adhesive tape, are commonly used to secure leadframes and reduce mold flash. However, mold flash continues to occur. Furthermore, adhesives must be cleaned from leadframes, increasing process steps and cost. Despite these efforts, flash continues to occur, even in the most carefully fabricated molds. There is therefore also a need to selectively shield integrated circuits compatibly with reducing mold flash.

After encapsulation, integrated circuits are arranged on a printed circuit board with other integrated circuits and electronic components. Small electronic devices require the integrated circuits to be very close together. However, some integrated circuits are sources of electromagnetic interference and must be spaced further away from other integrated circuits. This required spacing increases the size of the small electronic device being assembled. What is needed is a way to manufacture shielded integrated circuits while reducing mold flash.

Thus, a need still remains for improved encapsulation methods for shielded and unshielded integrated circuits that reduce size, reduce weight, and eliminate unwanted flash.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system. A leadframe is provided and a protruding pad is formed on the leadframe. A die is attached to the leadframe and electrically connected to the leadframe. At least portions of the leadframe, the protruding pad, and the die are encapsulated in an encapsulant.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
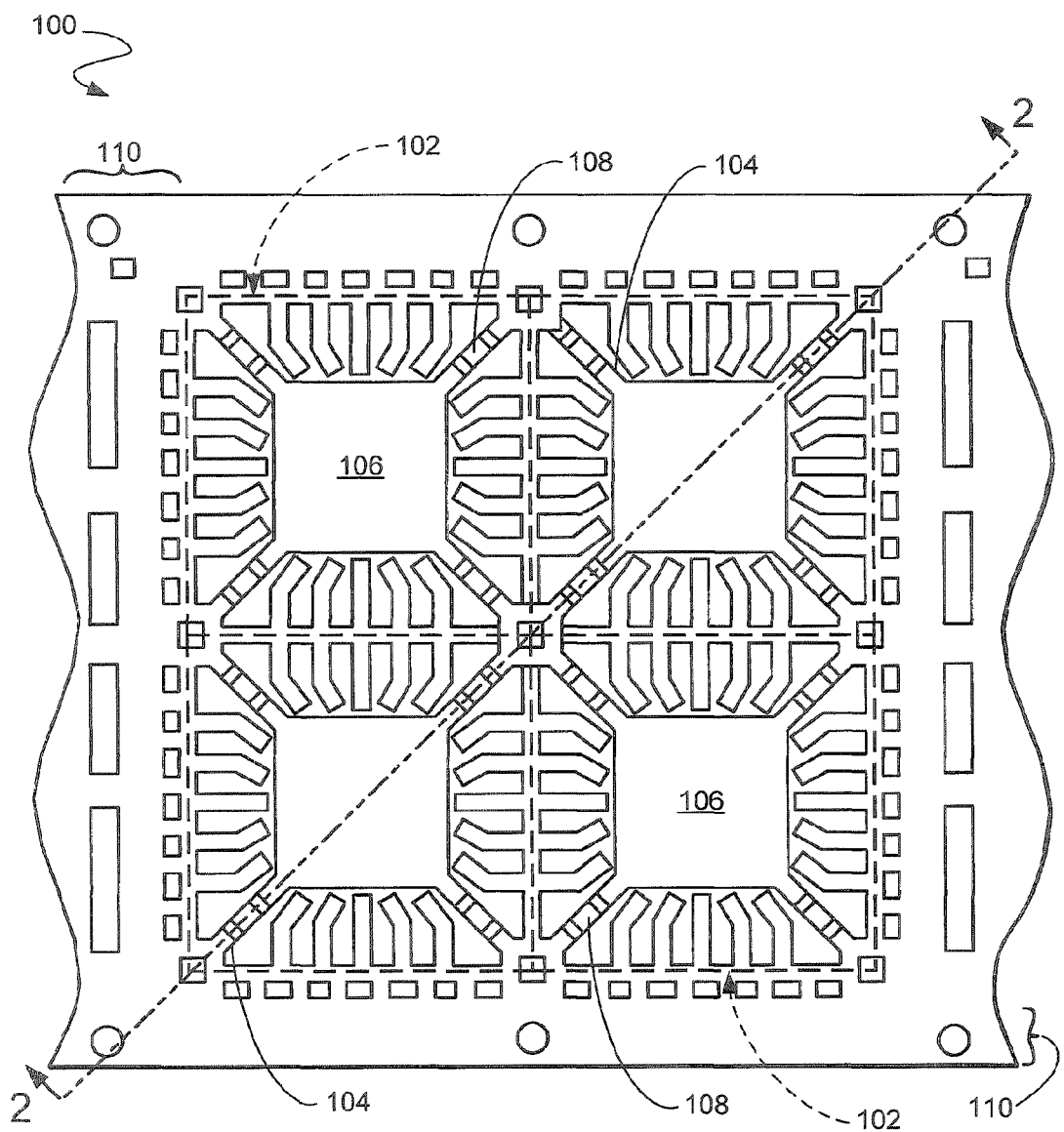
FIG. 1 is a system of protruding pad leadframes in accordance with an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown exaggerated in the FIGS. In addition where multiple embodiments are disclosed and described having some features in common, for clarity and ease of illustration, description, and comprehension thereof, like features one to another will ordinarily be described with like reference numerals.

The term "horizontal" as used herein is defined as a plane parallel to the conventional plane or surface of the leadframe, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Mold flash is a problem during the encapsulation of semiconductor packages. Typically, multiple semiconductor devices are mounted on a lead frame and the leadframe placed in a mold. A two part mold is generally used. Each half of the mold has a stiff backplate that is mounted on a platen of a hydraulic press.

The two halves of the mold are held apart. The lead frame containing semiconductor devices is placed in an open half of the mold. The leadframe is secured to the mold with an adhesive film. The adhesive film helps to prevent encapsulant from lifting the leadframe and seeping underneath.

Before the leadframe is secured to the mold, wire bonding electrically connects the die to the leadframe. During wire bonding the leadframe may bounce on the adhesive film, causing poor wire bonding quality. In addition, the adhesive tape obstructs some customized heater blocks from stabilizing half etched lead fingers during wire bonding.

After wire bonding, the hydraulic press is actuated and the mold closed, forming a cavity around each semiconductor die. It is not unusual for a mold to contain up to $10^2$ to $10^3$ cavities. Each of these cavities is connected by one or more gates, channels, and runners to one or more central reservoirs, or pots, in which a softened encapsulant is placed. A worm screw or ram compresses the encapsulant so that it flows into the cavities. As soon as the encapsulant has hardened, the mold is opened and the encapsulated assemblies removed.

Frequently, moveable pins are built into the mold to align the mold parts, to hold the lead frames in a particular location during molding, or to provide automatic ejection of the encapsulated parts. Also, the mold may contain other moving parts such as variable gates, vents, and dams. Thus, molds for encapsulating electronic parts, particularly semiconductor parts, are often very complicated and have numerous mechanisms protruding from the backplates of the mold.

In order to push liquefied encapsulant from the reservoirs into the many cavities, it is frequently necessary to inject or transfer the encapsulant at pressures exceeding $10^3$ psi. If the mold halves fail to seal tightly against each other or against the lead frame, undesired or unintended crevices may be present therebetween. At such high pressures, the crevices fill with encapsulant during encapsulation, producing thin webs of encapsulant where none are desired. These thin webs of encapsulant are referred to as flash and result generally from imperfect sealing of the mold. Before the encapsulated electronic devices can be used, this flash must be removed. This increases the cost of manufacture and is undesirable. Also, flash is a significant cause of mold wear, requires additional labor for mold cleaning between molding cycles, and increases mold down-time.

In addition to cleaning of the mold, further steps are needed to clean the encapsulated packages. The adhesive film leaves residue on the bottom surfaces of the leadframes. Thus the residue must be cleaned from the packages. Furthermore, the adhesive film does not always hold, allowing lifting of the leadframe and formation of mold flash under the leadframes. Thus, the mold flash must be cleaned from the packages.

After the packages have been cleaned and prepared, they are placed in a singulation device, such as a saw singulation device, and singulated.

Figure 3:
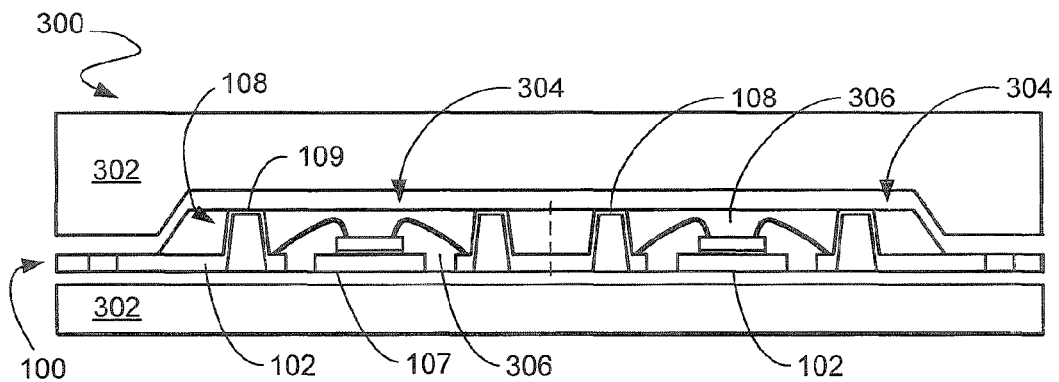
FIG. 3 is a cross section of a mold and the system, the cross section of the system being taken along line 3-3 in FIG. 4.

Referring now to FIG. 1, therein is shown a system 100 of protruding pad leadframes 102 in accordance with an embodiment of the present invention. The protruding pad leadframes 102 are formed using standard leadframe manufacturing processes such as etching and stamping. The protruding pad leadframes 102 have protruding pads 108 that are raised sections of the protruding pad leadframes 102 that protrude above the dies and are of approximately the same height as a wire or ball bonds that couple the dies to the protruding pad leadframes 102, as shown in FIG. 3. The protruding pads 108 and the protruding pad leadframes 102 are structured to be vertically clamped to hold the protruding pad leadframes 102 in place for various manufacturing operations.

The protruding pad leadframes 102 have tie bars 104 securing die pads 106 therewithin. The protruding pads 108 are formed, in one embodiment, by punching the tie bars 104. The protruding pads 108 and the protruding pad leadframes 102 can be clamped in one embodiment in a mold (not shown) during an encapsulation operation. Leadframe connection bars 110 surround the protruding pad leadframes 102.

Figure 2:
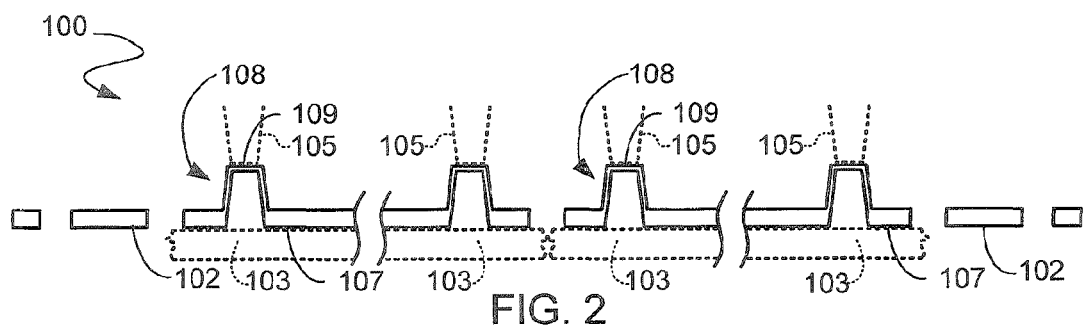
FIG. 2 is a cross section of the system, taken along line 2-2 in FIG. 1, and showing in greater detail the profile of the protruding pads.

Referring now to FIG. 2, therein is shown a cross section of the system 100, taken along line 2-2 in FIG. 1, and showing in greater detail the profile of the protruding pads 108. In one embodiment, the system 100 or protruding pad leadframes 102 provides advantages during wire bonding of dies (not shown) to the protruding pad leadframes 102. It has been discovered that eliminating adhesive film (not shown) reduces leadframe bouncing during wire bonding. Therefore, in lieu of the adhesive, to prevent movement and improve the accuracy of wire bonding, the protruding pad leadframes 102 are clamped by a fixture 103 on the bottom 107 and the leadframe connection bars 110 are clamped by a fixture 105 on the top 109 during wire bonding. After wire bonding, the protruding pad leadframes 102 are ready for encapsulation.

Figure 4:
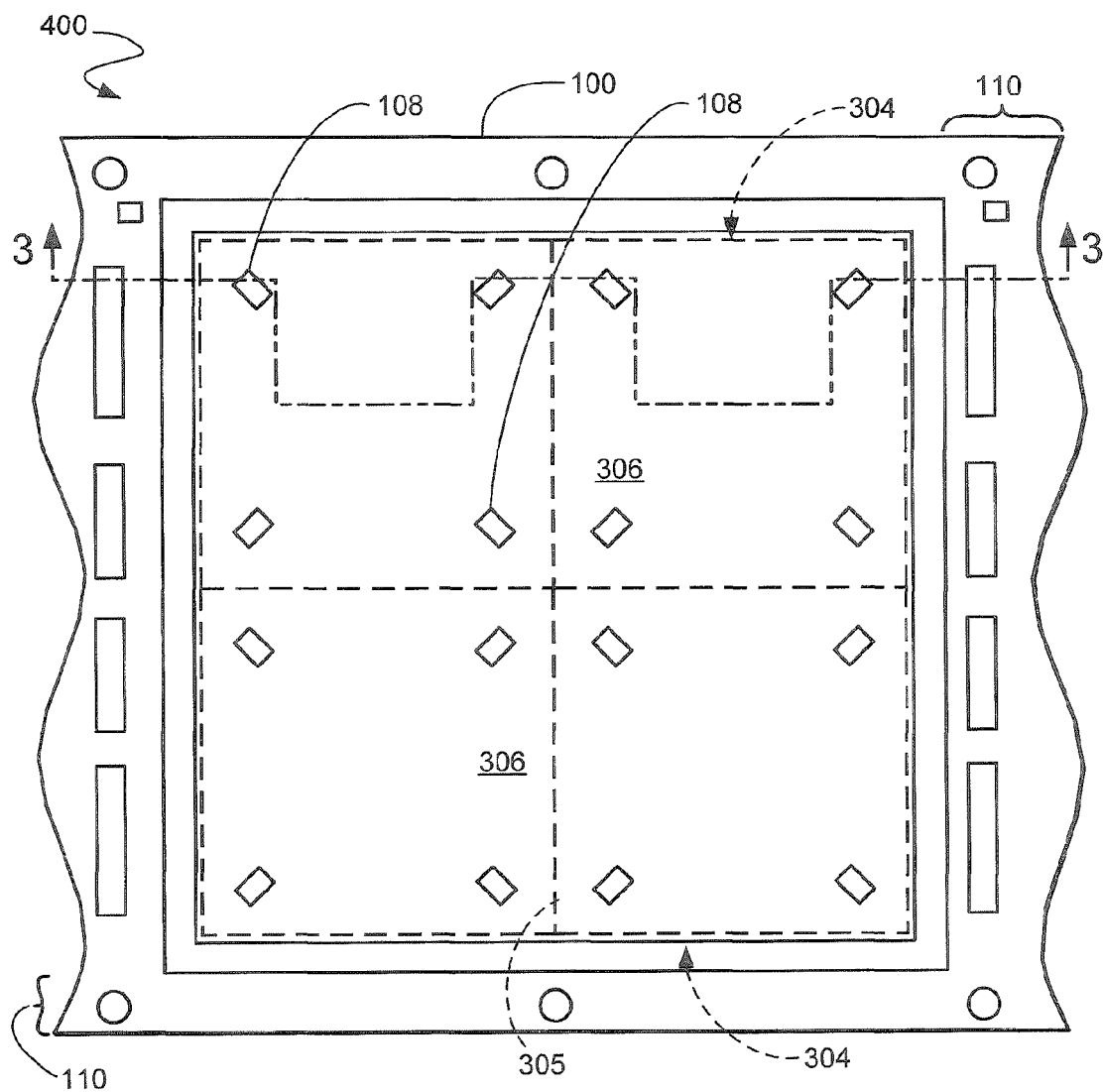
FIG. 4 is an encapsulated system formed by encapsulating the structures within the mold in FIG. 3.

Referring now to FIG. 3, therein is shown a cross section 300 of a mold 302 and the system 100, the cross section of the system 100 being taken along line 3-3 in FIG. 4. Protruding pad packages 304 have been formed within the mold 302 using standard processes, such as encapsulation of elements such as dies 305 and wires 307 with an encapsulant 306. It has been discovered that using the mold 302 to clamp the protruding pad leadframes 102 on the bottom 107 and the protruding pads 108 on the top 109 reduces mold flash. By distributing the clamping forces of the mold 302 on the protruding pad leadframes 102, the protruding pads 108 provide better stability and reduce lifting of the protruding pad leadframes 102 during encapsulation. Thus, mold flash is reduced and the need for adhesive film is eliminated.

Referring now to FIG. 4, therein is shown an encapsulated system 400 formed as described above with respect to FIG. 3 by encapsulating the structures within the mold 302 (FIG. 3). Following encapsulation, the encapsulated system 400 has been removed from the mold 302. The encapsulation has left the tops of the protruding pads 108 exposed. The protruding pad packages 304 are now ready for singulation along the dotted lines 305 and for removal of the leadframe connection bars 110.

Figure 5:
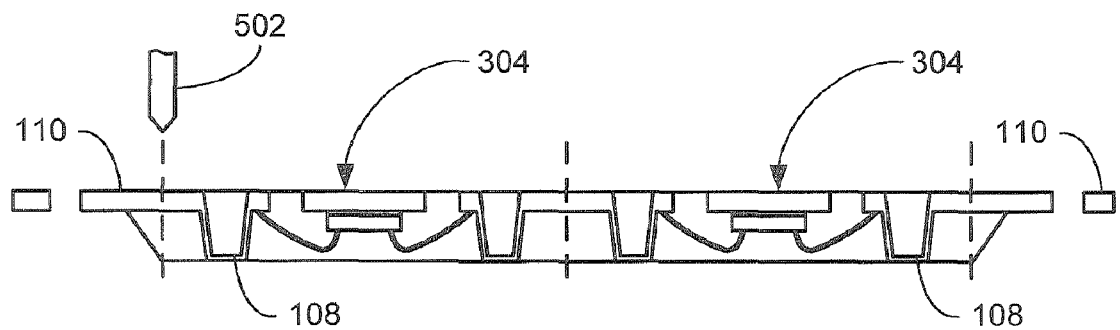
FIG. 5 is a cross section, taken along line 3-3 in FIG. 4, of the encapsulated system after being inverted and while undergoing singulation.

Referring now to FIG. 5, therein is shown an inverted cross sectional view of the system 100 of FIG. 3 undergoing singulation. A saw 502 singulates the protruding pad packages 304 and removes the leadframe connection bars 110. The protruding pads 108 may be exposed from the encapsulant 306, of FIG. 3, on a top surface and a bottom surface of the protruding pad packages 304.

Figure 6:
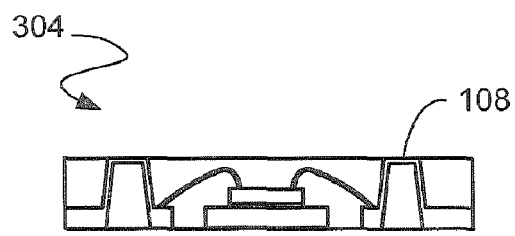
FIG. 6 is the protruding pad package of FIG. 5 after singulation.

Referring now to FIG. 6, therein is shown the protruding pad package 304 after singulation to form a singulated package 600.

In some applications, the electrical functions of electronic components within packages, such as the protruding pad package 304, are susceptible to electromagnetic energy emanating from other packages and components located in close proximity. In other cases they are themselves sources of such radiation. In order to minimize such electromagnetic interference, sources of undesirable electromagnetic energy are shielded and may be electrically grounded.

Figure 7:
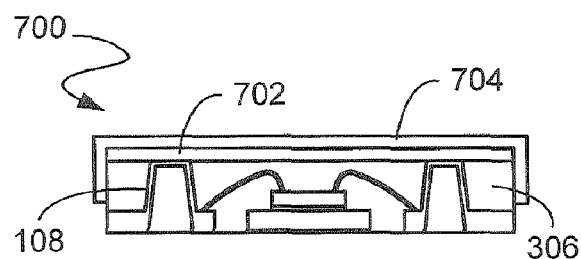
FIG. 7 is the singulated package of FIG. 6 after further processing to form a protruding pad package which is shielded, in accordance with an alternative embodiment of the present invention.

Referring now to FIG. 7, therein is shown the singulated package 600 (FIG. 6) after further processing to form a protruding pad package 700 which is shielded, in accordance with an alternative embodiment of the present invention. An adhesive 702, such as a conductive epoxy, attaches a package cover 704, such as a heat sink, electromagnetic interference shield, or radio frequency interference shield, to the encapsulant 306. In this embodiment, the package cover 704 comprises the top and sides of the protruding pad package 700. In one embodiment, the package cover 704 is grounded and protects the protruding pad package 700 from external sources of interferences, such as electromagnetic interference. In another embodiment, the package cover 704 is grounded and protects external packages (not shown) from interference, such as electromagnetic interference, originating from the protruding pad package 700.

Figure 8:
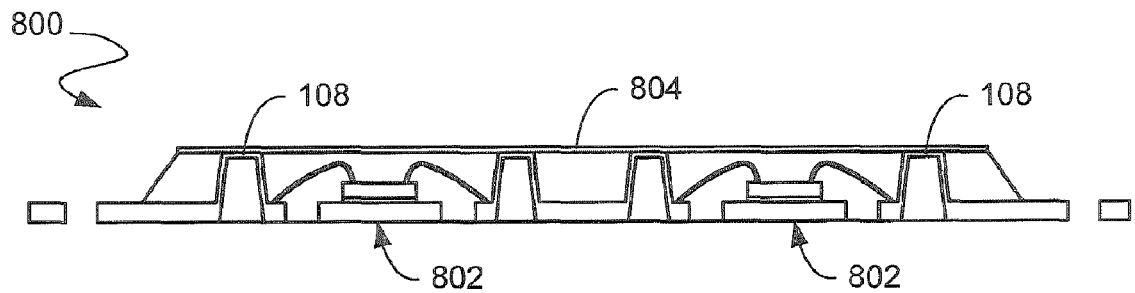
FIG. 8 is a cross section of protruding pad packages which are shielded, adhesive-less, and have protruding pads, in accordance with an alternative embodiment of the present invention.

Referring now to FIG. 8, therein is shown a cross section 800 of protruding pad packages 802 which are shielded, adhesive-less, and have protruding pads 108, in accordance with an alternative embodiment of the present invention. The protruding pad packages 802 have been manufactured using standard processes and are ready for singulation. However, prior to singulation, a package cover 804, such as a film coating, is sprayed directly on the top of the protruding pad packages 802. The package cover 804 is conductive and grounded, providing a shield for the protruding pad package 802.

Figure 9:
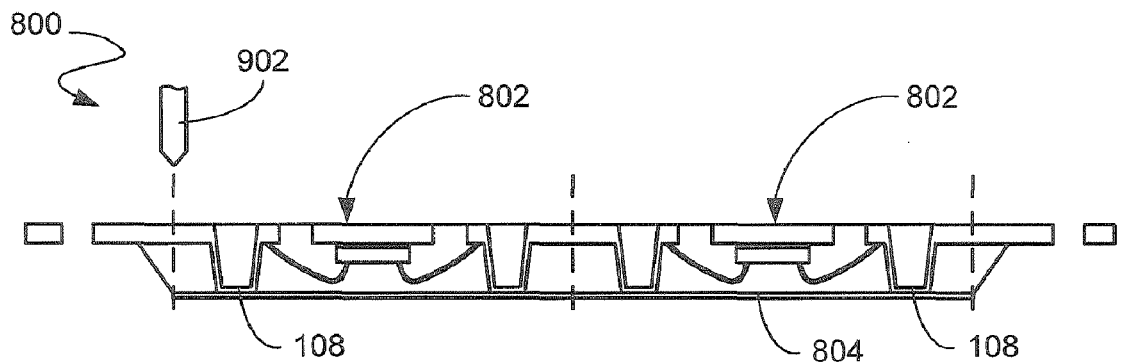
FIG. 9 is the structure of FIG. 8 after being flipped and readied for singulation.

Referring now to FIG. 9, therein is shown the structure of FIG. 8 after being flipped and readied for singulation. A saw 902 then singulates the protruding pad packages 802.

Figure 10:
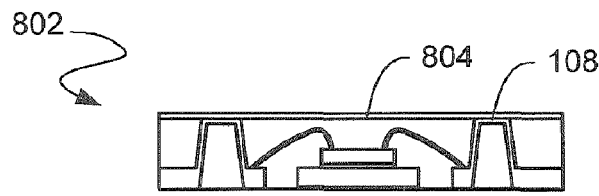
FIG. 10 is the protruding pad package of FIG. 9 after singulation.

Referring now to FIG. 10, therein is shown the protruding pad package 802 after singulation.

Figure 11:
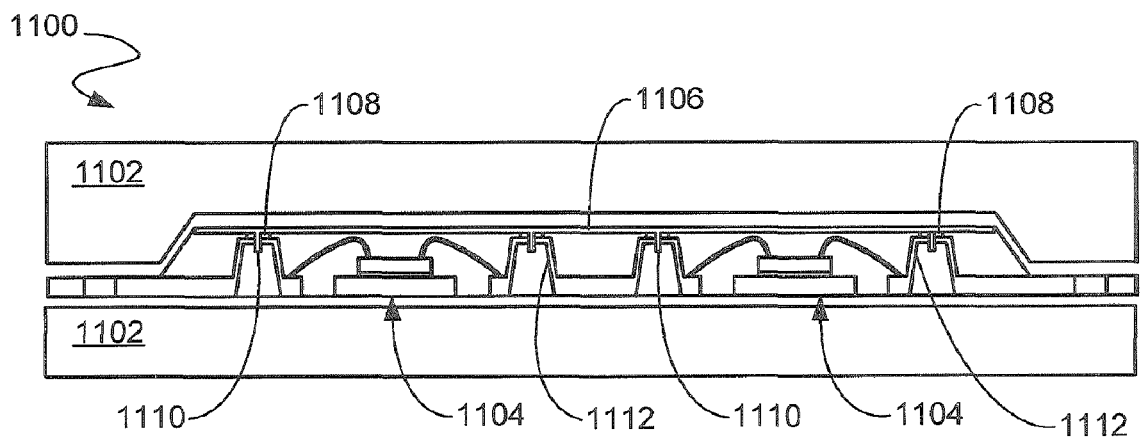
FIG. 11 is a cross section of a mold and of protruding pad packages in accordance with another embodiment of the present invention.

Referring now to FIG. 11, therein is shown a cross section 1100 of a mold 1102 and of protruding pad packages 1104 in accordance with another embodiment of the present invention. A package cover 1106 is attached to the protruding pad packages 1104 with an adhesive 1108. The package cover 1106 is additionally secured with protruding legs 1110. The protruding legs 1110 are anchored in protruding pads 1112 to further secure the package cover 1106.

Figure 12:
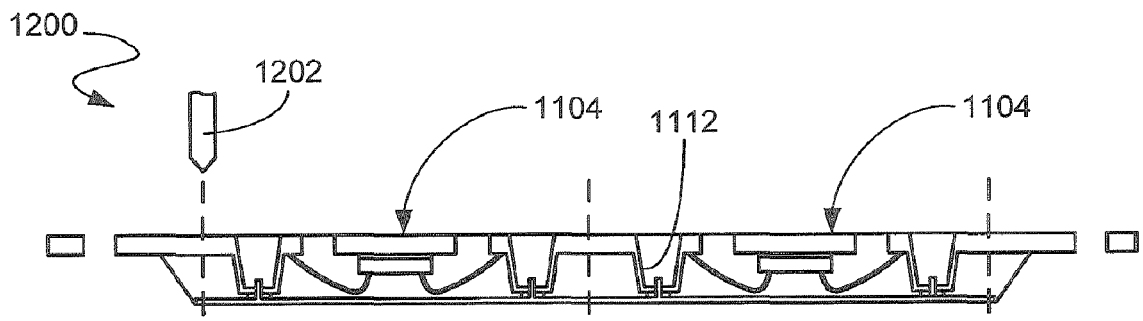
FIG. 12 is a cross section of an encapsulated system formed by encapsulating the structures within the mold of FIG. 11 after being inverted and while undergoing singulation.

Referring now to FIG. 12, therein is shown in cross section the singulation of an encapsulated system 1200, formed by encapsulating the structures within the mold 1102 (FIG. 11), after being inverted. A saw 1202 singulates the protruding pad packages 1104.

Figure 13:
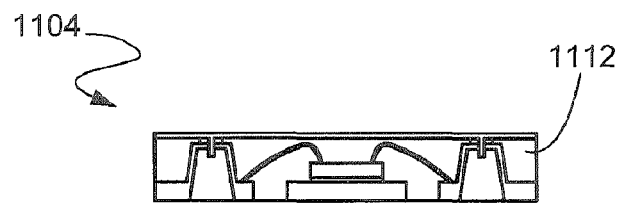
FIG. 13 is the protruding pad package of FIG. 12 after singulation.

Referring now to FIG. 13, therein is shown the protruding pad package 1104 after singulation.

Figure 14:
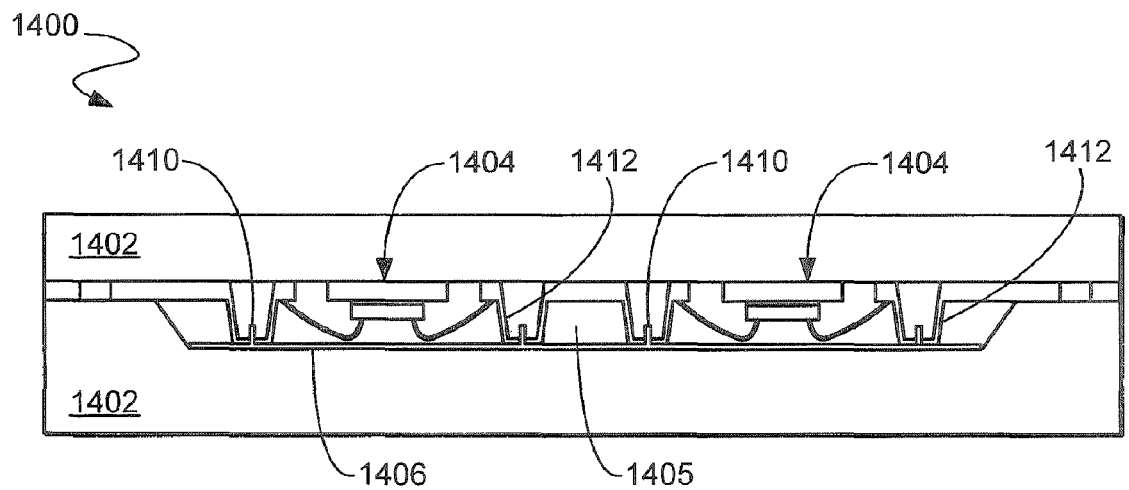
FIG. 14 is a cross section of a mold and of protruding pad packages, which are adhesive-less in accordance with another embodiment of the present invention.

Referring now to FIG. 14, therein is shown a cross section 1400 of a mold 1402 and of protruding pad packages 1404 which are adhesive-less in accordance with another embodiment of the present invention. Prior to injection of encapsulant 1405, the mold 1402 is inverted and a package cover 1406 is placed inside. Inverting the mold 1402 eliminates the need for the adhesive 1108 (FIG. 11). Protruding legs 1410 are anchored in protruding pads 1412 to further secure the package cover 1406.

Figure 15:
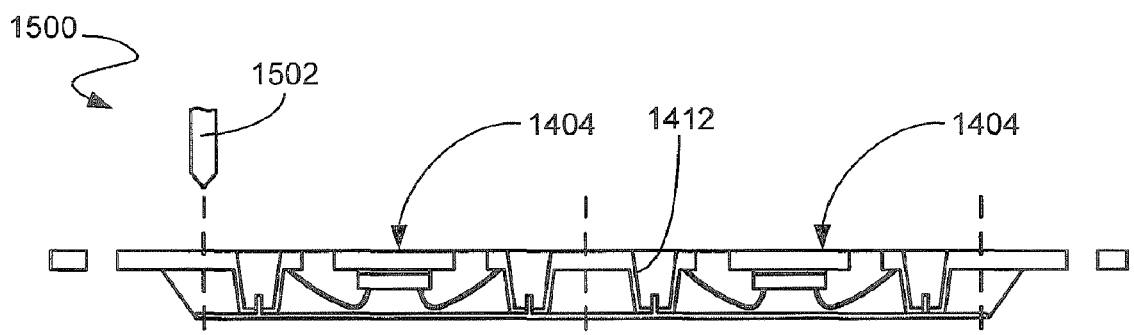
FIG. 15 is a cross section of an encapsulated system formed by encapsulating the structures within the mold in FIG. 14.

Referring now to FIG. 15, therein is shown in cross section the singulation of an encapsulated system 1500 formed by encapsulating the structures within the mold 1402 (FIG. 14). A saw 1502 singulates the protruding pad packages 1404.

Figure 16:
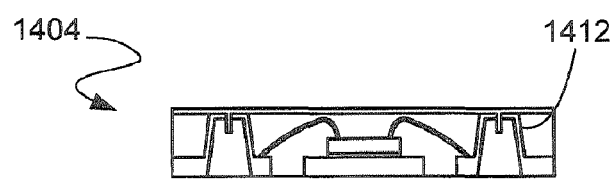
FIG. 16 is the protruding pad package of FIG. 15 after singulation.

Referring now to FIG. 16, therein is shown the protruding pad package 1404 after singulation.

Figure 17:
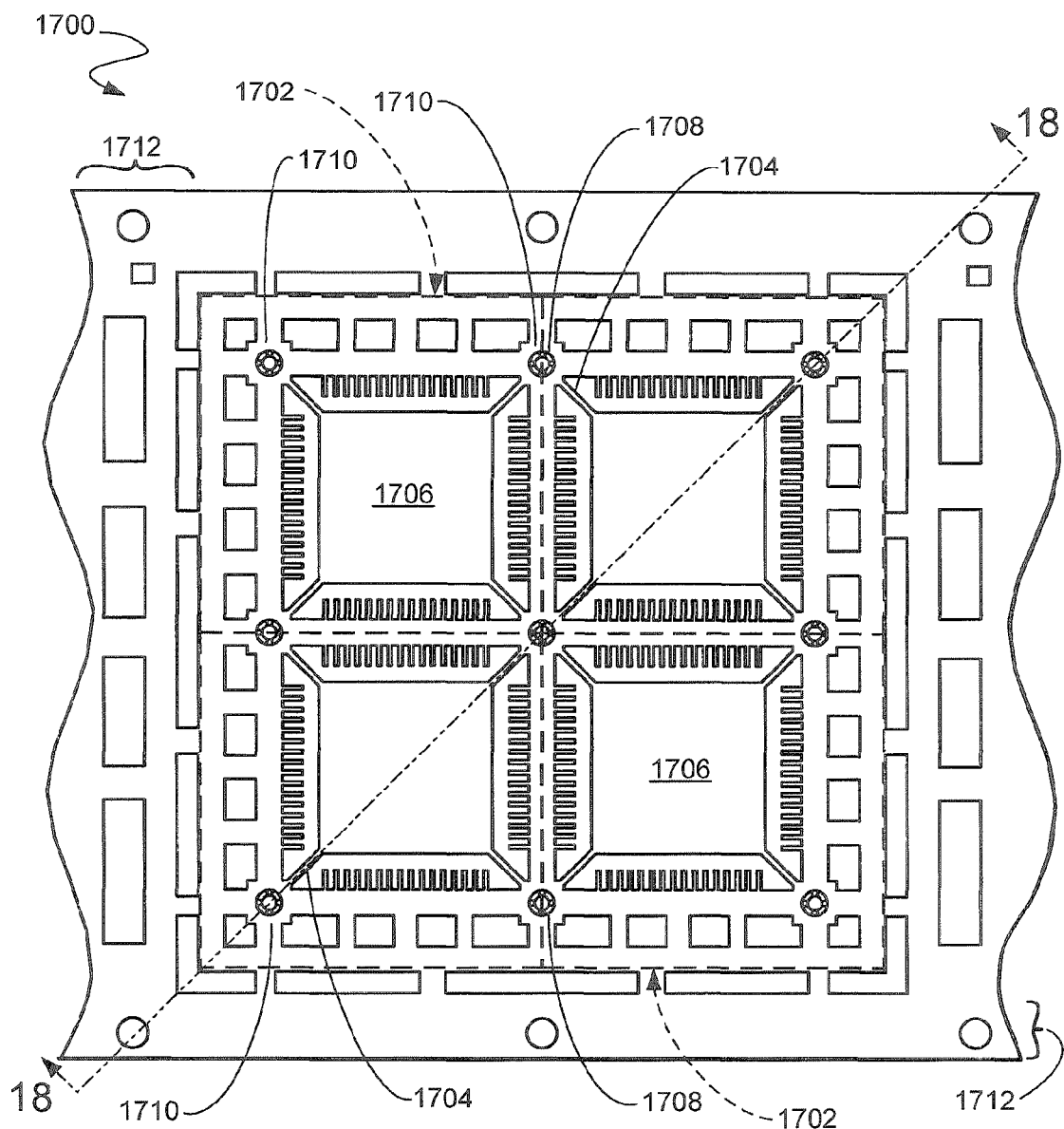
FIG. 17 is a system of corner protruding pad leadframes in accordance with another embodiment of the present invention.

Referring now to FIG. 17, therein is shown a system 1700 of corner protruding pad leadframes 1702 in accordance with another embodiment of the present invention. The corner protruding pad leadframes 1702 are formed using standard leadframe manufacturing processes such as etching and stamping. The corner protruding pad leadframes 1702 have tie bars 1704 securing die pads 1706 therewithin. Corner protruding pads 1708 are formed, in one embodiment, by punching corner ends 1710 of the tie bars 1704. Leadframe connection bars 1712 surround the corner protruding pad leadframes 1702.

Figure 18:
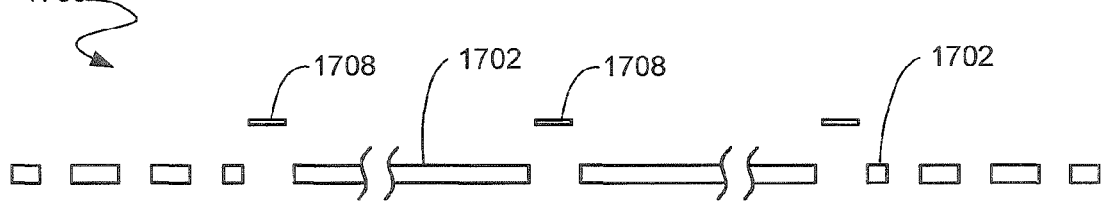
FIG. 18 is a cross section of the system, taken along line 18-18 in FIG. 17, and showing in greater detail the profile of the corner protruding pads.

Referring now to FIG. 18, therein is shown a cross section of the system 1700, taken along line 18-18 in FIG. 17, and showing in greater detail the profile of the corner protruding pads 1708. In one embodiment, the system 1700 of corner protruding pad leadframes 1702 provides advantages to wire bonding of dies (not shown) to the corner protruding pad leadframes 1702. It has been discovered that eliminating adhesive film (not shown) reduces leadframe bouncing during wire bonding. Therefore, in lieu of the adhesive, to prevent movement and improve the accuracy of wire bonding, the corner protruding pad leadframes 1702 are clamped on the bottom and the leadframe connection bars 1712 are clamped on the top during wire bonding. After wire bonding, the corner protruding pad leadframes 1702 are ready for encapsulation.

Figure 19:
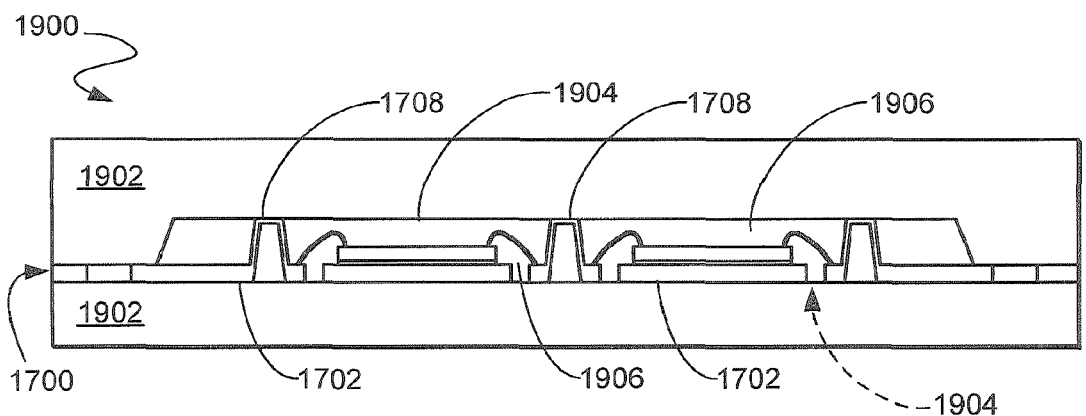
FIG. 19 is a cross section of a mold and the system, the cross section of the system being taken along line 19-19 in FIG. 20.
Figure 20:
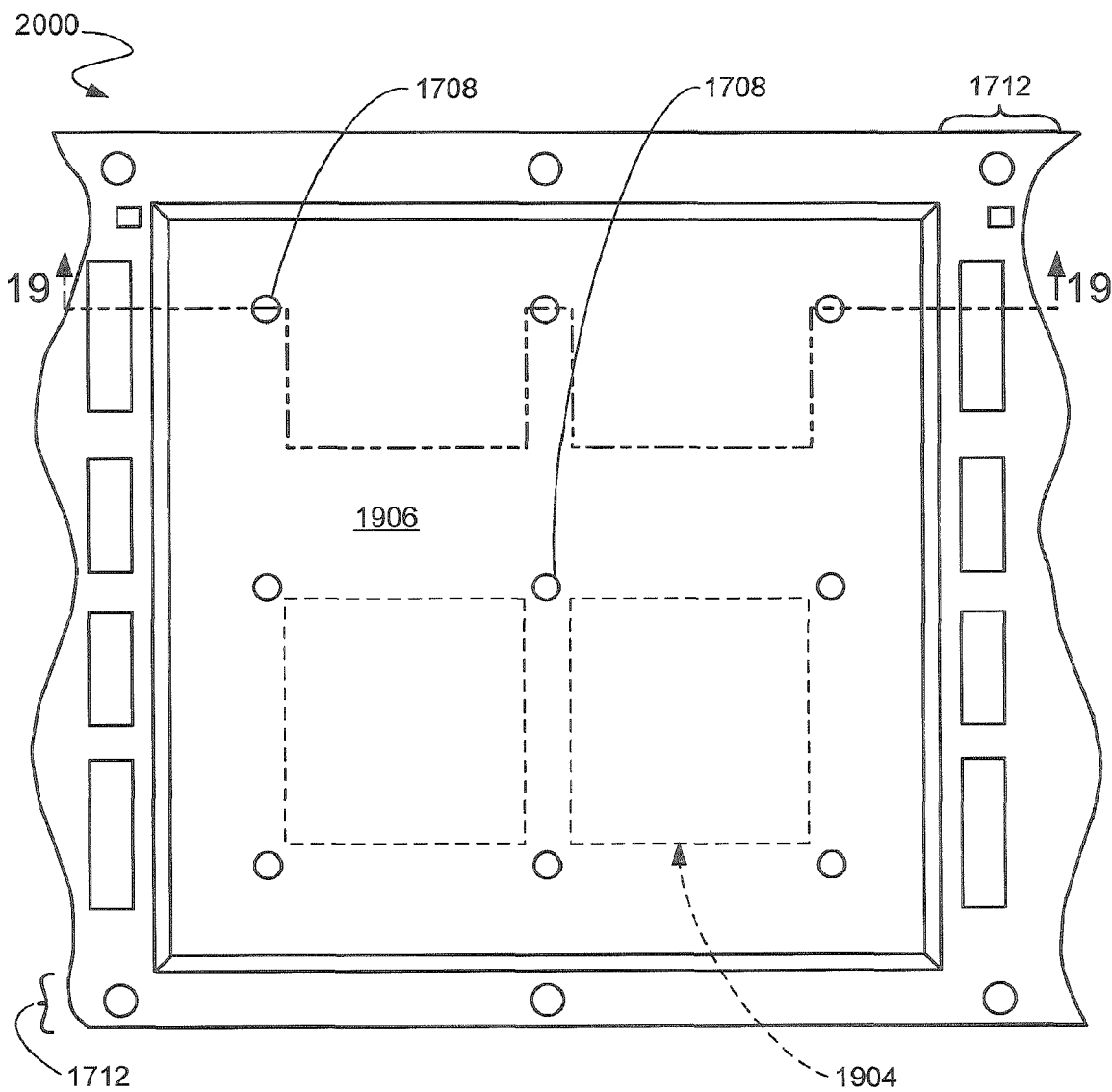
FIG. 20 is an encapsulated system formed by encapsulating the structures within the mold in FIG. 19.

Referring now to FIG. 19, therein is shown a cross section 1900 of a mold 1902 and the system 1700, the cross section of the system 1700 being taken along line 19-19 in FIG. 20. Protruding pad-less packages 1904 have been formed within the mold 1902 using standard processes, such as encapsulation with an encapsulant 1906. It has been discovered that using the mold 1902 to clamp the corner protruding pad leadframes 1702 on the bottom and the corner protruding pads 1708 on the top reduces mold flash. By distributing the clamping forces of the mold 1902, the corner protruding pads 1708 provide better stability and reduce lifting of the corner protruding pad leadframes 1702 during encapsulation. Thus, mold flash is reduced and the need for adhesive film is eliminated.

Referring now to FIG. 20, therein is shown an encapsulated system 2000 formed as described above with respect to FIG. 19 by encapsulating the structures within the mold 1902 (FIG. 19). Following encapsulation, the encapsulated system 2000 has been removed from the mold 1902. The encapsulation has left the tops of the protruding pads 1708 exposed. The protruding pad-less packages 1904 are now ready for singulation and for removal of the leadframe connection bars 1712.

Figure 21:
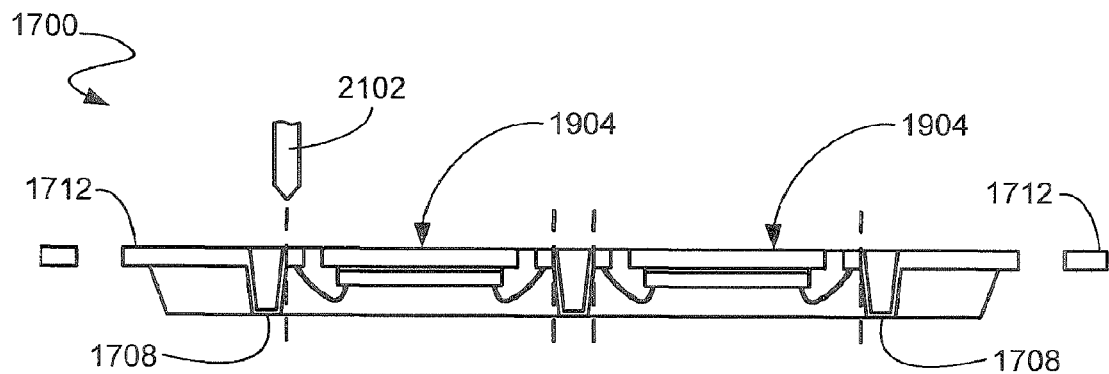
FIG. 21 is a cross section, taken along line 19-19 in FIG. 20, of the encapsulated system after being inverted and while undergoing singulation.

Referring now to FIG. 21, therein is shown an inverted cross sectional view of the system 1700 of FIG. 19 undergoing singulation. A saw 2102 singulates the protruding pad-less packages 1904, removing the corner protruding pads 1708 along with the leadframe connection bars 1712.

Figure 22:
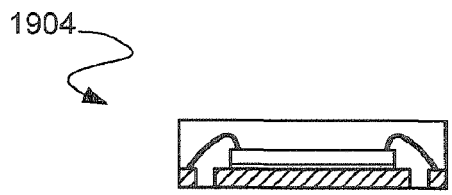
FIG. 22 is the protruding pad-less package of FIG. 21 after singulation.

Referring now to FIG. 22, therein is shown the protruding pad-less package 1904 after singulation.

In some applications, the electrical functions of electronic components within packages, such as the protruding pad package 1904, are susceptible to electromagnetic energy emanating from other packages and components located in close proximity. In other cases they are themselves sources of such radiation. In order to minimize such electromagnetic interference, sources of undesirable electromagnetic energy are shielded and may be electrically grounded.

Figure 23:
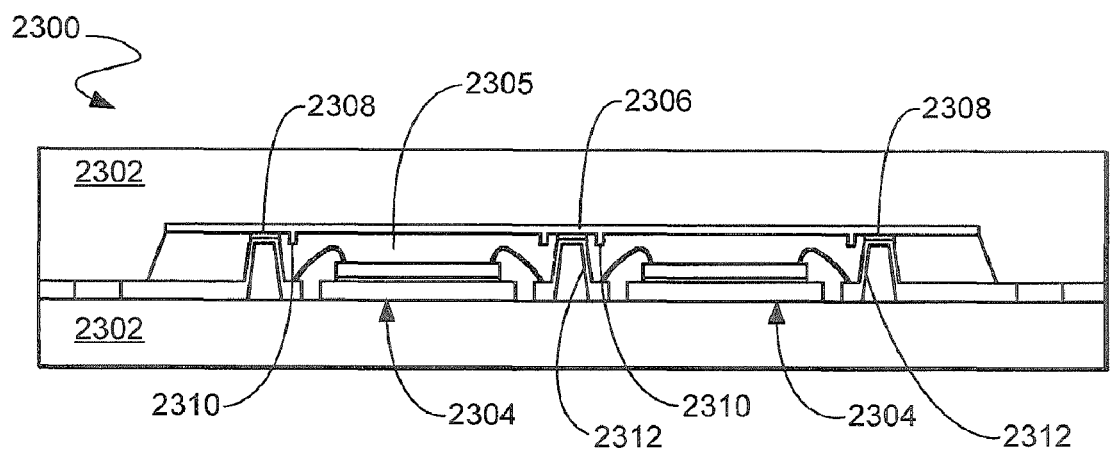
FIG. 23 is a cross section of a mold and of protruding pad-less packages, which are shielded in accordance with another embodiment of the present invention.

Referring now to FIG. 23, therein is shown a cross section 2300 of a mold 2302 and of protruding pad-less packages 2304 which are shielded in accordance with another embodiment of the present invention. Prior to injection of encapsulant 2305, package cover 2306 is attached to the protruding pad-less packages 2304 with an adhesive 2308 on protruding pads 2312. The package cover 2306 is additionally secured with protruding legs 2310. The protruding legs 2310 are anchored in the encapsulant 2305 to further secure the package cover 2306.

Figure 24:
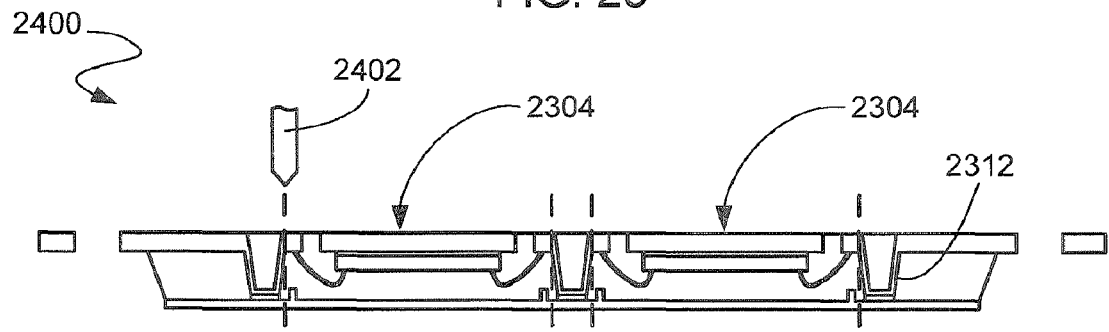
FIG. 24 is a cross section of an encapsulated system formed by encapsulating the structures within the mold in FIG. 23.

Referring now to FIG. 24, therein is shown in cross section the singulation of an encapsulated system 2400 formed by encapsulating the structures within the mold 2302 (FIG. 23). A saw 2402 singulates the protruding pad-less packages 2304.

Figure 25:
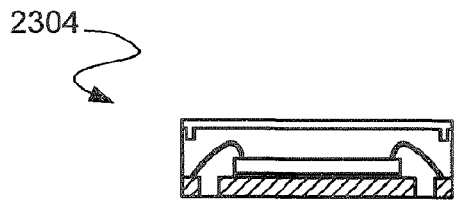
FIG. 25 is the protruding pad-less package of FIG. 24 after singulation.

Referring now to FIG. 25, therein is shown the protruding pad-less package 2304 after singulation.

Figure 26:
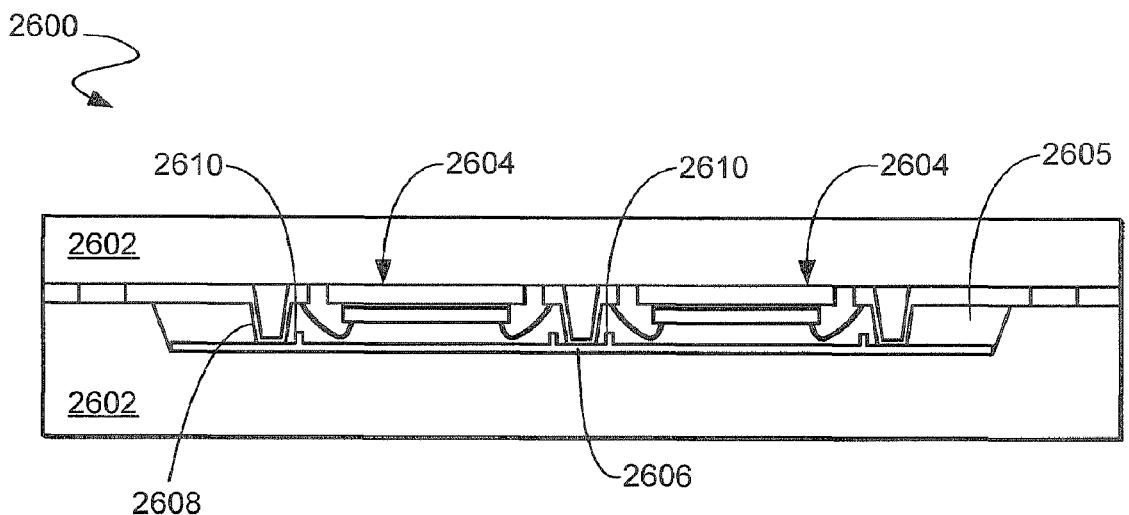
FIG. 26 is a cross section of a mold and of protruding pad-less packages, which are shielded and adhesive-less in accordance with another embodiment of the present invention.

Referring now to FIG. 26, therein is shown a cross section 2600 of a mold 2602 and of protruding pad-less packages 2604 which are shielded and adhesive-less in accordance with another embodiment of the present invention. Prior to injection of encapsulant 2605, the mold 2602 is inverted and a package cover 2606 is placed inside. Inverting the mold 2602 eliminates the need for the adhesive 2308 (FIG. 23) on protruding pads 2608. Protruding legs 2610 are anchored in the encapsulant 2612 to further secure the package cover 2606.

Figure 27:
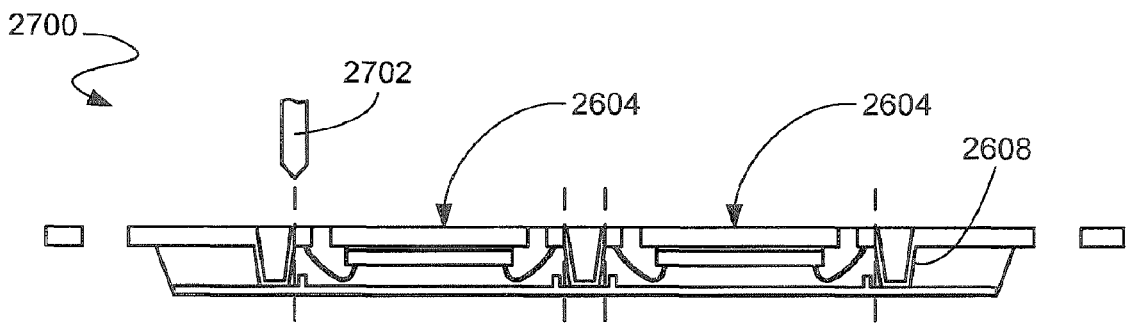
FIG. 27 is a cross section of an encapsulated system formed by encapsulating the structures within the mold of FIG. 26.

Referring now to FIG. 27, therein is shown in cross section the singulation of an encapsulated system 2700 formed by encapsulating the structures within the mold 2602 (FIG. 26). A saw 2702 singulates the protruding pad-less packages 2604.

Figure 28:
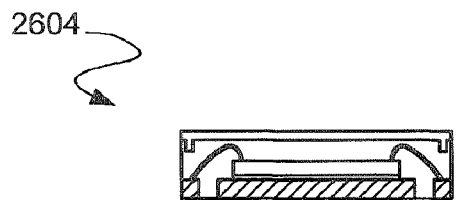
FIG. 28 is the protruding pad-less package of FIG. 27 after singulation.

Referring now to FIG. 28, therein is shown the protruding pad-less package 2604 after singulation.

Figure 29:
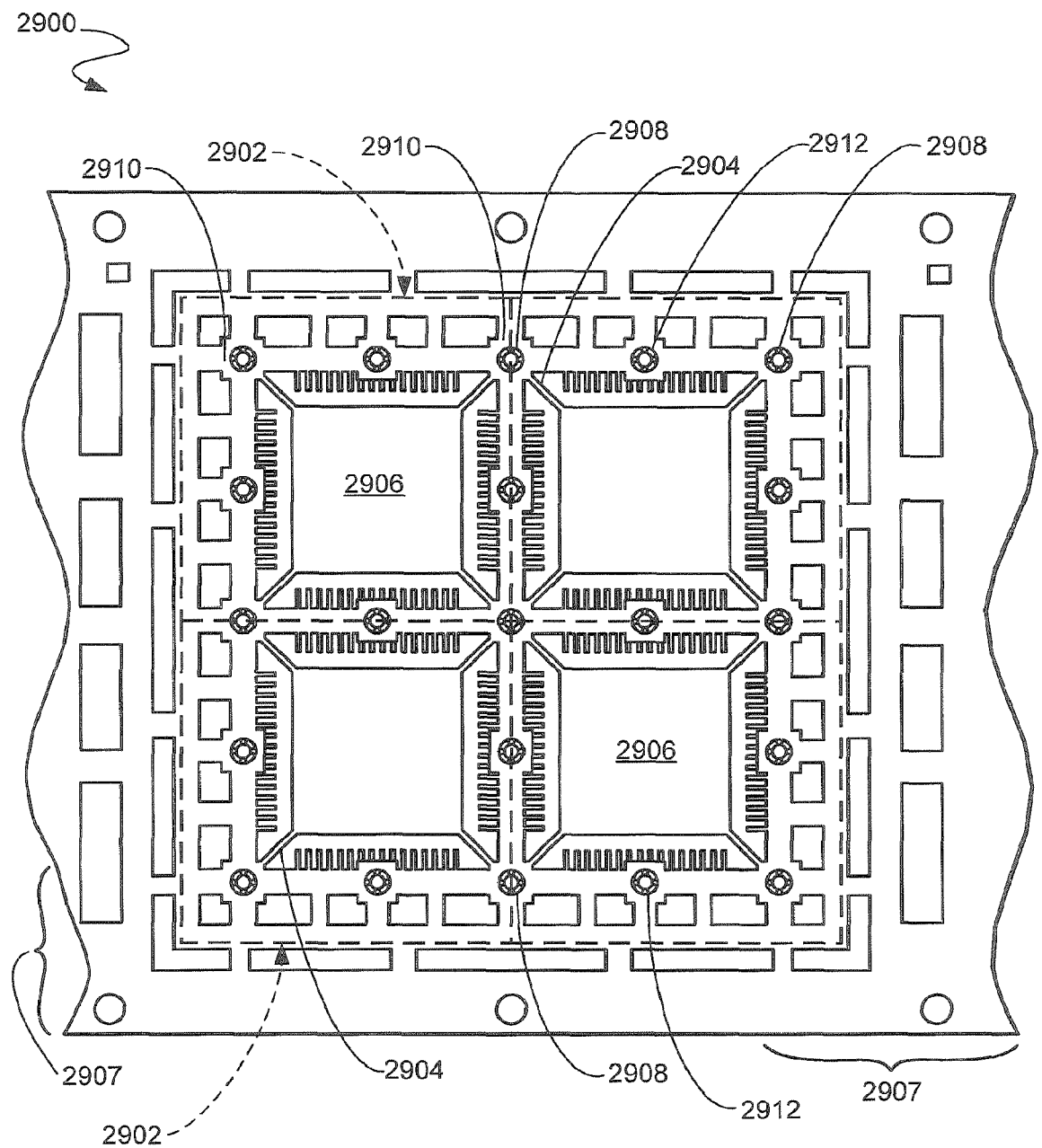
FIG. 29 is a system of enhanced corner protruding pad leadframes in accordance with another embodiment of the present invention.

Referring now to FIG. 29, therein is shown a system 2900 of enhanced corner protruding pad leadframes 2902 in accordance with another embodiment of the present invention. The enhanced corner protruding pad leadframes 2902 are formed using standard leadframe manufacturing processes such as etching and stamping. The enhanced corner protruding pad leadframes 2902 have tie bars 2904 securing a die pad 2906 therewithin. Corner protruding pads 2908 are formed, in one embodiment, by punching corner ends 2910 of the tie bars 2904.

Leadframe connection bars 2907 surround the die pad 2906. Leadframe connection bar protruding pads 2912 are formed by punching the leadframe connection bars 2907. The leadframe connection bar protruding pads 2912 provide additional clamping to the enhanced corner protruding pad leadframes 2902 during encapsulation, thus reducing mold flash.

During clamping of leadframes deformation or buckling can occur along leadframe connection bars. In order to minimize deformation or buckling, sources of stress relief may be added to leadframes.

Figure 30:
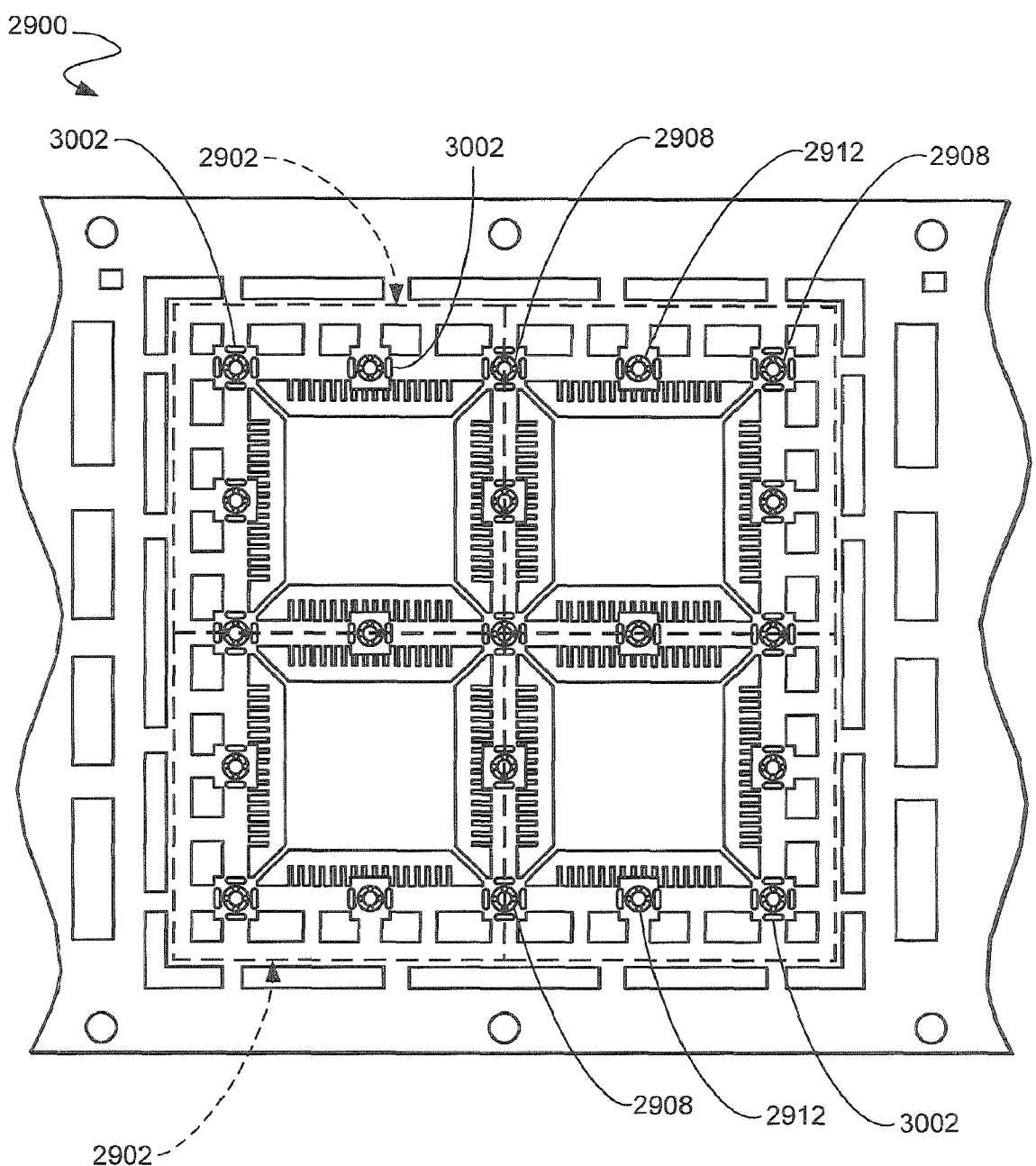
FIG. 30 is the system of FIG. 29 after further processing, in accordance with another embodiment of the present invention.

Referring now to FIG. 30, therein is shown the system 2900 after further processing, in accordance with another embodiment of the present invention. Stress relief holes 3002 have been added, in one embodiment by punching, to the enhanced corner protruding pad leadframes 2902. The stress relief holes 3002 are formed around the corner protruding pads 2908 and the leadframe connection bar protruding pads 2912. By reducing stress to the enhanced corner protruding pad leadframes 2902, the stress relief holes 3002 reduce deformation or buckling during clamping.

Figure 31:
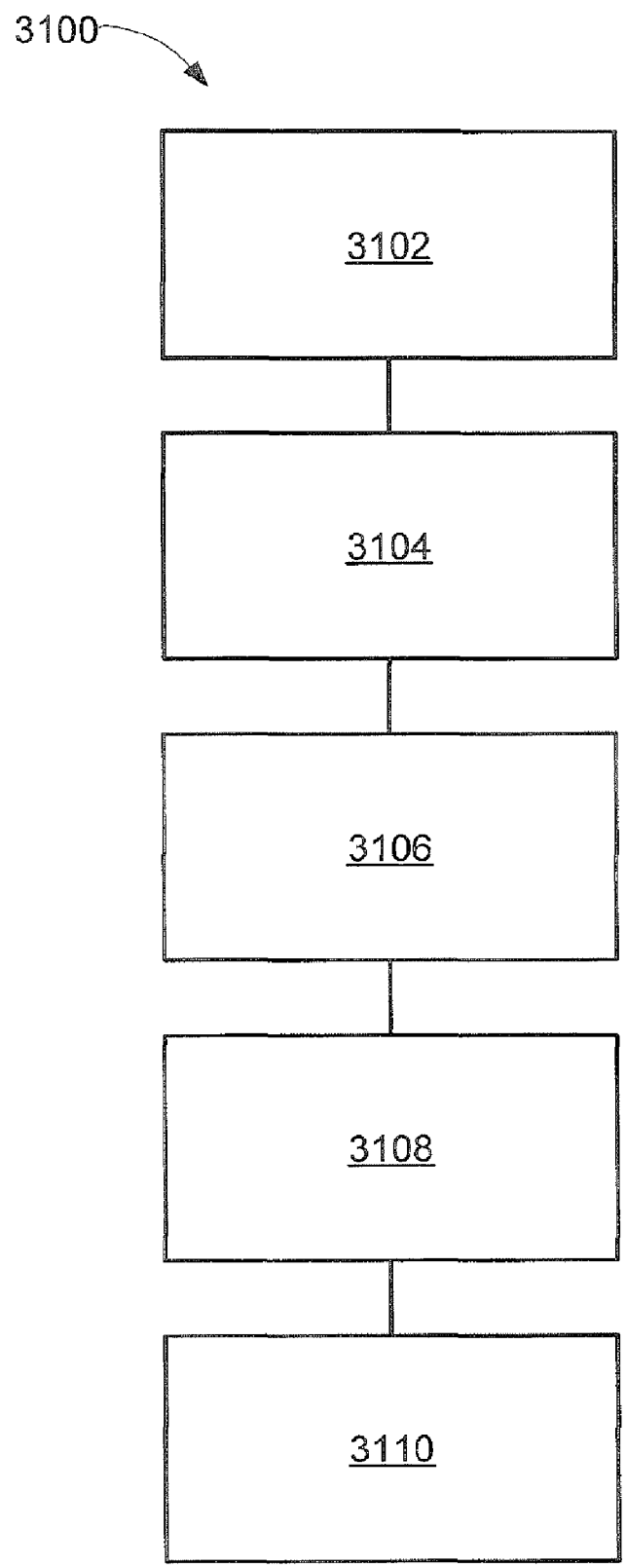
FIG. 31 is a flow chart of a method for manufacturing protruding pad packages in accordance with the present invention.

Referring now to FIG. 31, therein is shown a flow chart of an integrated circuit package system 3100 for manufacturing a protruding pad package in accordance with the present invention. The method 3100 includes providing a leadframe in a block 3102; forming a protruding pad on the leadframe in a block 3104; attaching a die to the leadframe in a block 3106; electrically connecting the die to the leadframe in a block 3108; and encapsulating at least portions of the leadframe, the protruding pad, and the die in an encapsulant in a block 3110.

Thus, it has been discovered that the protruding pad package method and apparatus of the present invention furnish important and heretofore unknown and unavailable solutions, capabilities, and functional advantages for protruding pad packages. The resulting process and configurations are straightforward, economical, uncomplicated, highly versatile, and effective, and can be implemented by adapting known components for ready manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method for manufacturing a package comprising:
providing a leadframe with a tie bar and leadframe connection bars;
punching the tie bar and optionally the leadframe connection bars to form protruding pads;
clamping the leadframe and the protruding pads in a mold;
attaching dies to the leadframe;
electrically connecting the dies to the leadframe with wires wherein the protruding pads protrude above the dies and are substantially the same height as the wires that couple the dies to the leadframe;
encapsulating at least portions of the leadframe, the protruding pads, the dies, and the wires in an encapsulant to form a protruding pad package including the protruding pads exposed from the encapsulant at the top surface and the bottom surface of the protruding pad package;
singulating the protruding pad package; and
attaching a package cover to the encapsulant, optionally with an adhesive.

2. The method as claimed in claim 1 wherein singulating the protruding pad package forms singulated protruding pad packages or singulated protruding pad-less packages.

3. A method for manufacturing a package comprising:
providing a leadframe with a tie bar and leadframe connection bars;
punching the a tie bar and optionally the leadframe connection bars to form protruding pads;
clamping the leadframe and the protruding pads in a mold;
attaching dies to the leadframe;
electrically connecting the dies to the leadframe with wires wherein the protruding pads protrude above the dies and are substantially the same height as the wires that couple the dies to the leadframe;
encapsulating at least portions of the leadframe, the protruding pads, the dies, and the wires in an encapsulant to form a protruding pad package including the protruding pads exposed from the encapsulant at the top surface and the bottom surface of the protruding pad package;
singulating the protruding pad package;
attaching a package cover to the encapsulant, optionally with an adhesive; and
securing the package cover with protruding legs optionally anchored in the protruding pads.

4. The method as claimed in claim 3 wherein singulating the protruding pad package forms singulated protruding pad packages or singulated protruding pad-less packages.

* * * * *